(12) United States Patent  (10) Patent No.: US 6,747,728 B2
Nagayama (45) Date of Patent: Jun. 8, 2004

(54) LUMINESCENT DISPLAY AND A METHOD PRODUCING THE SAME

(75) Inventor: Kenichi Nagayama, Yamagata (JP)

(73) Assignee: Tohoku Pioneer Corporation, Yamagata (JP)

( * ) Notice: Subject to any disclaimer, the term of this patent is extended or adjusted under 35 U.S.C. 154(b) by 0 days.

(21) Appl. No.: 10/419,727

(22) Filed: Apr. 22, 2003

(65) Prior Publication Data

US 2004/0070336 A1 Apr. 15, 2004

Related U.S. Application Data

(62) Division of application No. 09/691,067, filed on Oct. 19, 2000, now Pat. No. 6,590,335.

(30) Foreign Application Priority Data

Oct. 19, 1999 (JP) .............................................. 11-296172

(51) Int. Cl.$^7$ ................................ G02F 1/13; H01J 1/62
(52) U.S. Cl. ......................... 349/192; 349/39; 313/504; 313/503
(58) Field of Search ................................. 349/192, 187, 349/38, 39, 40, 42, 43; 345/76, 77; 315/169.3, 169.1; 313/503, 504, 512

(56) References Cited

U.S. PATENT DOCUMENTS 5,608,245 A 3/1997 Martin ........................ 257/291
6,410,167 B2 6/2002 Ishibashi et al. ............ 428/690
6,468,822 B2 * 10/2002 Maeda et al. ................. 438/30
6,476,881 B2 * 11/2002 Ozaki et al. ................... 349/43

FOREIGN PATENT DOCUMENTS

JP 2001-176672 6/2001

* cited by examiner

*Primary Examiner*—Tuyet T. Vo
(74) *Attorney, Agent, or Firm*—Sughrue Mion, PLLC

(57) ABSTRACT

In a luminescent display, when a shortcircuit between the transparent electrode 102 and the metal electrode 104 occurs and a defective pixel such as a pixel which does not luminesce or a luminescence-defective pixel is formed, repairing is performed so as to remove only a part B corresponding to the defective part, in the metal electrode 104 corresponding to the region which corresponds to the defective part, and in which the transparent electrode 102 and the metal electrode 104 intersect with each other. Therefore, a current flow between the metal electrode 104 and the transparent electrode 102 which face each other via an organic layer 103 is allowed by the metal electrode 104 in the remaining part A, thereby enabling the pixel and the subsequently scanned pixels to luminesce. The corresponding part of the metal electrode 104 is removed away by irradiating the part with a laser beam.

2 Claims, 4 Drawing Sheets

LUMINESCENT DISPLAY AND A METHOD PRODUCING THE SAME

This is a divisional of application Ser. No. 09/691,067 filed Oct. 19, 2000 now U.S. Pat. No. 6,590,335 B1; the disclosure of which is incorporated herein by reference.

BACKGROUND OF THE INVENTION

1. Field of the Invention

The present invention relates to a luminescent display in which an organic electroluminescent (organic EL) element is preferably used as a luminescent element, and also to a method of producing it.

2. Description of the Related Art

Conventionally, an organic EL element is known which is enabled to luminesce by causing a current to flow through a phosphor member formed on a glass plate or a translucent organic film.

FIG. 4 diagrammatically shows a sectional structure of a luminescent display in which an organic EL element is used as a luminescent element. As shown in FIG. 4, the luminescent display of the conventional art is configured by sequentially stacking a transparent electrode (layer) 302, an organic layer 303, and a metal electrode (layer) 304 on a transparent substrate 301.

Usually, an organic EL element is seemed to be a capacitive luminescent element which is equivalently expressed by a circuit resistance component, a capacitance component, and a luminescence component. When a voltage is applied across the transparent electrode 302 and the metal electrode 304, therefore, charges corresponding to the electric capacitance of the element flow into the electrodes as a displacement current to be accumulated therein. When the voltage exceeds a fixed level (barrier voltage), a current flows into the organic layer 303 configured by an organic EL element, via the electrodes 302 and 304, and luminescence is started in proportion to the current.

FIG. 5 shows an example of an arrangement of transparent electrodes and metal electrodes in a luminescent display of simple matrix driving.

As shown in FIG. 5, a luminescent display in which the above-mentioned organic EL element is used as a luminescent element is formed by, on a transparent glass substrate 101, sequentially stacking: plural parallel stripe-like transparent electrodes 102 which are made of ITO or the like and arranged at predetermined intervals; a luminescent portion 103 configured by an organic layer; and plural parallel stripe-like metal electrodes 104 which are perpendicular to the transparent electrodes 102 and arranged at predetermined intervals. In order to attain moisture proofing, a protective film which is not shown is formed over the whole face of the substrate 101 on which the metal electrodes 104 and the organic layer 103 are formed.

In the luminescent display, formed are luminescent pixels each configured by setting, as one unit, one of regions of the organic layer 103 where paired ones of the transparent electrodes 102 and the metal electrodes 104 intersect and face each other with interposing the respective regions. A required number of the pixels are arranged into a matrix form, thereby forming a luminescent display of simple matrix driving.

In the thus formed luminescent display, a driving source which scan-drives the transparent electrodes 102 and the metal electrodes 104 adequately applies a voltage across the transparent electrode 102 and the metal electrode 104 that correspond to an appropriate pixel, and a current flows through the organic layer 103 of the corresponding pixel, so that light is emitted.

In production of such a luminescent display, the possibility of occurrence of a damage or deposition of particles is higher as the area of the display screen is larger. This is a great factor of a reduced yield in the production.

When a flaw 10 is produced in the transparent electrode 302 or a particle 20 is deposited onto the transparent electrode 302 as shown in FIG. 4, the organic layer 303 is insufficiently grown in the corresponding portion of the surface of the transparent electrode 302. A defect 30 may be caused in the organic layer 303 by any reason.

As a result, in the part where the organic layer 303 is insufficiently grown, the metal electrode layer 304 may be directly grown on the transparent electrode layer 302, so that the transparent electrode layer 302 serving as an anode may be short-circuited with the metal electrode layer 304 serving as a cathode.

Even when such a defect does not result in a short circuit, the organic layer 303 between the transparent electrode 302 and the metal electrode 304 is grown so as to be very thin, and the current for luminescence is concentrated into the thinned part. As a result, the current hardly flows through the peripheral region of the part, thereby producing a problem in that the pixel fails to luminesce. This problem is the greatest factor of a failure in production, and largely lowers the production yield.

Therefore, a countermeasure such as that a substrate is elaborately washed has been taken. However, such washing requires much labor. Furthermore, it is impossible to completely eliminate particles or flaws in the transparent electrode 302, or irregularity of the surface of the transparent electrode 302 by washing.

As described above, in a luminescent display in which an organic EL element is used as a luminescent element, when a concave flaw exists or dust is deposited onto the transparent electrode 302, the film growth is insufficiently performed in the part, and the organic layer 303 which is stacked on the transparent electrode 302 is formed so as to be thin. In the case where the film growth is performed by vapor deposition, particularly, when a convex part is formed by dust or the like, vapor deposition is hardly performed on side faces of the convex part, and hence the film growth is insufficiently performed.

In the thinned part of the organic layer 303, the distance between the cathode and the anode is shorter than that in another part, and therefore the current is easily concentrated to cause a problem in that the cathode and the anode are short-circuited. Even when such a defect does not result in a short circuit, the current for luminescence is concentrated into the thinned part of the grown film. As a result, the current hardly flows through the peripheral region of the part, thereby producing a problem in that the pixel fails to luminesce.

SUMMARY OF THE INVENTION

The invention has been conducted in view of the above-discussed problems. It is an object of the invention to provide a luminescent display in which a defect due to a short circuit between a transparent electrode and a metal electrode is repaired and the yield can be improved, and also a method of producing such a luminescent display.

According to a first aspect of the invention, in a luminescent display in which a first electrode, a luminescent portion, and a second electrode are sequentially stacked on a substrate, when a part of the luminescent portion is defective, only a part of the second electrode and corresponding to the defective part is removed away, a remaining part of the second electrode is left, and the defective luminescent pixel is enabled to luminesce by the first electrode and the remaining part of the second electrode.

According to a second aspect of the invention, in luminescent display in which plural first electrodes that are arranged at predetermined intervals, a luminescent portion, and plural second electrodes that are perpendicular to the first electrodes, and that are arranged at predetermined intervals are sequentially stacked on a substrate, a luminescent pixel is formed by using, as a unit, a region where one of the first electrodes and one of the second electrodes face and intersect with each other with interposing the region, and a predetermined number of such luminescent pixels are arranged in a matrix form, when an arbitrary one of the luminescent pixels which are arranged in a matrix form is defective, only a part of the second electrode and corresponding to the defective luminescent pixel is removed away, a remaining part of the second electrode is left, and the defective luminescent pixel is enabled to luminesce by the first electrode and the remaining part of the second electrode.

According to a third aspect of the invention, in the luminescent display of the second aspect of the invention, an organic electroluminescent element is used as the luminescent display.

According to a fourth aspect of the invention, in the luminescent display of the third aspect of the invention, the first electrodes are transparent electrodes, the luminescent portion is an organic layer configured by an organic electroluminescent element, and the second electrodes are metal electrodes.

According to a fifth aspect of the invention, in the luminescent display of the fourth aspect of the invention, the transparent electrodes, the organic layer, and the metal electrodes are sequentially stacked on a transparent substrate.

According to a sixth aspect of the invention, in the luminescent display of the fifth aspect of the invention, a protective film is formed on the transparent substrate on which the organic layer and the metal electrodes are formed.

According to a seventh aspect of the invention, in the luminescent display of any one of the second to fifth aspects of the invention, the luminescent display is driven by simple-matrix driving.

According to an eighth aspect of the invention, in a method of producing a luminescent display in which plural first electrodes that are arranged at predetermined intervals, a luminescent portion, and plural second electrodes that are perpendicular to the first electrodes, and that are arranged at predetermined intervals are sequentially stacked on a substrate, a luminescent pixel is formed by using, as a unit, a region where one of the first electrodes and one of the second electrodes and intersect with face each other with interposing the region, and a predetermined number of such luminescent pixels are arranged in a matrix form, the method comprises the steps of forming the first electrodes on the substrate; sequentially stacking the luminescent portion and the second electrodes; when an arbitrary one of the luminescent pixels which are arranged in a matrix form is defective, irradiating only a part of the second electrodes and corresponding to the defective luminescent pixel, with light; and removing away only the part which is irradiated with light.

According to a ninth aspect of the invention, in the method of producing a luminescent display of the eighth aspect of the invention, the substrate and the first electrodes are optically transparent, and the luminescent portion contains an organic compound.

In the invention configured as described above, even when a short circuit between the transparent electrode and the metal electrode, or the like occurs and a defective pixel such as a pixel which does not luminesce or a luminescence-defective pixel is formed, repairing is performed so as to remove only a part corresponding to the defective part, in the metal electrode corresponding to the region which corresponds to the defective pixel, and in which the transparent electrode and the metal electrode intersect with each other. Therefore, a current flow between the metal electrode and the transparent electrode which face each other via the organic layer is allowed by the remaining metal electrode, thereby enabling the pixel and the subsequently scanned pixels to luminesce.

According to this configuration, it is possible to design a luminescent display which can be sufficiently put into a practical use even when the display has few defective pixels, thereby contributing to an improved yield due to repairing of defects.

DETAILED DESCRIPTION OF THE PREFERRED EMBODIMENTS

Figure 1:
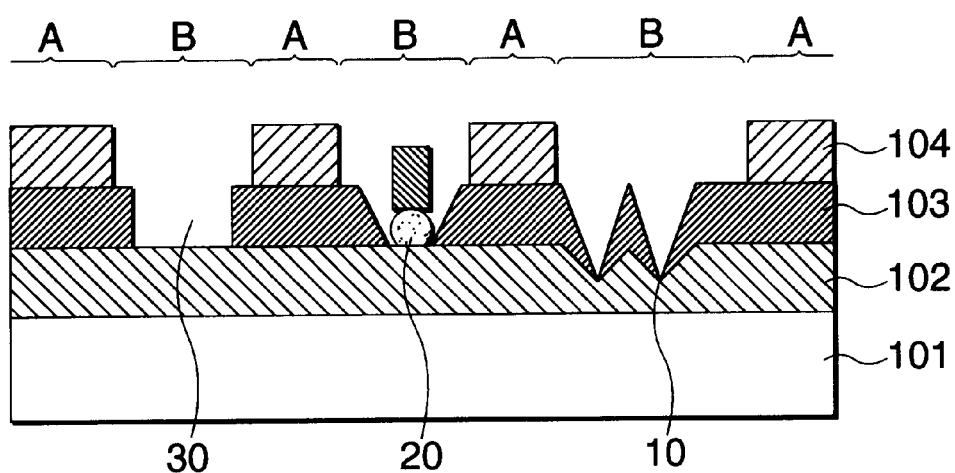
FIG. 1 is a view schematically showing a section of a layer structure of a luminescent display which is an embodiment of the invention.

FIG. 1 is a view schematically showing a section of a layer structure of a luminescent display which is an embodiment of the invention. As shown in FIG. 1, the luminescent display of the invention is formed by, on a transparent glass substrate 101, sequentially stacking by vapor deposition: plural transparent electrodes 102 which are made of ITO or the like and serve as first electrodes; an organic layer 103; and plural parallel metal electrodes 104 which intersect with the transparent electrodes 102 and serve as plural second electrodes.

A luminescent portion serving a luminescent display in which an organic EL element is used is formed by the transparent electrodes 102 and the metal electrodes 104 between which the organic layer 103 is interposed, and which are paired with each other. Each pixel is formed by using, as one unit, a luminescent portion of an intersection region where a corresponding pair of the transparent electrode 102 and the metal electrode 104 face each other.

Figure 4:
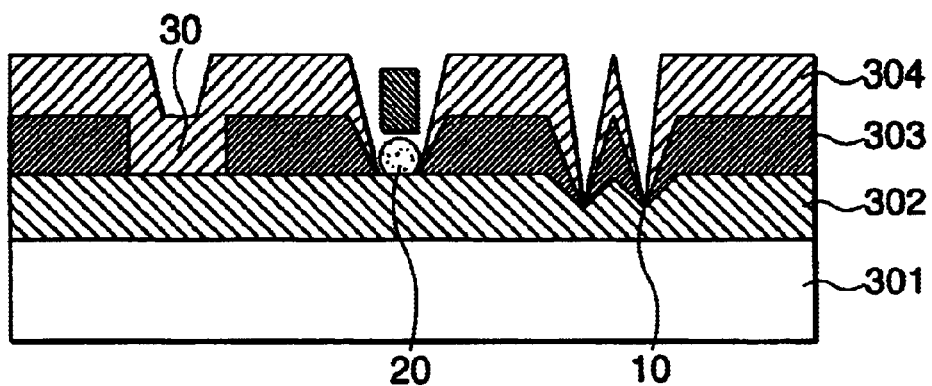
FIG. 4 is a view schematically showing a sectional structure of a luminescent display of the conventional art.
Figure 5:
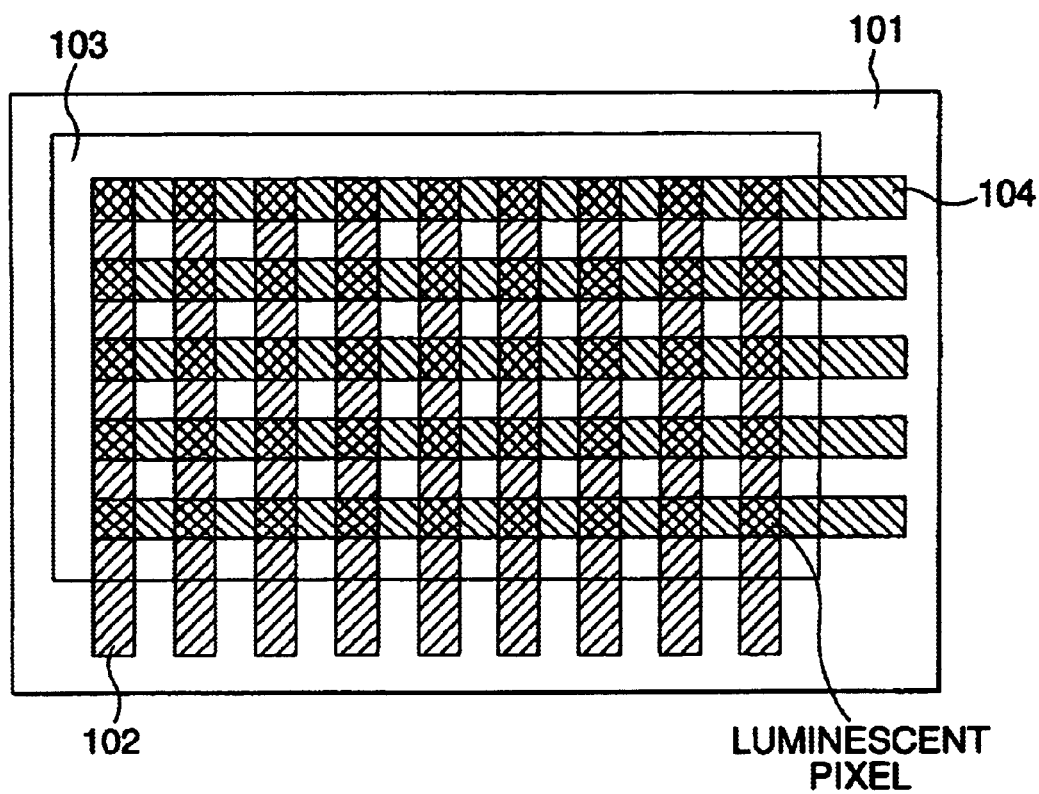
FIG. 5 is a view showing an example of an arrangement of transparent electrodes and metal electrodes in a luminescent display of simple matrix driving using an organic EL element of the conventional art.

In the display, defective pixels respectively including a flaw 10, a particle 20, and another defect 30 of the organic layer which are similar to the defects shown in FIG. 4 are formed. A part B of the metal electrodes 104 corresponding to the defective part, and the remaining part A in the periphery of the part B is left. According to this configuration, the concentration of a current is eliminated, and the current is caused to flow through the peripheral part so as to expedite normal luminescence of the pixel.

Considering the fact that a defective part is sufficiently smaller than one pixel, in the defective part, only the defective part of metal electrode is removed away, a current flow between the metal electrode and the transparent electrode 102 which face each other via the organic layer 103 is allowed by the metal electrode 104 in the remaining part A excluding the defective part of the defective pixel, so that the defective pixel luminesces, thereby attaining improvement of the yield due to repairing. Depending on the kind of the method of removing the metal electrode 104, there is a possibility that a part or the whole of the organic layer 103 or the transparent electrode 102 in a defective part A is simultaneously removed away. However, this does not produce a serious problem.

The metal electrode 104 is made of aluminum, magnesium, indium, or one of alloys of these metals and having a small work function, such as an Al—Li alloy. The transparent electrodes 102 may be made of an electrically conductive material such as ITO and having a large work function, gold, or the like. When gold is used as the electrode material, the electrode has a translucent state.

Figure 2A:
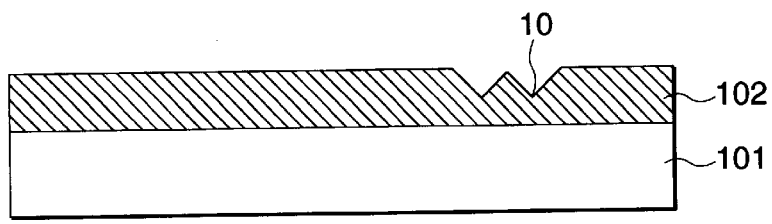
FIGS. 2A to 2E are views showing steps of producing the luminescent display of the embodiment of the invention.

FIGS. 2A to 2E are views showing steps of producing the luminescent display of simple matrix driving shown in FIG. 1. Referring to FIG. 2A, first, an electrode material such as ITO is vapor-deposited on the transparent substrate 101, and the plural transparent electrodes 102 are formed by patterning based on the photolithography technique.

Figure 2B:
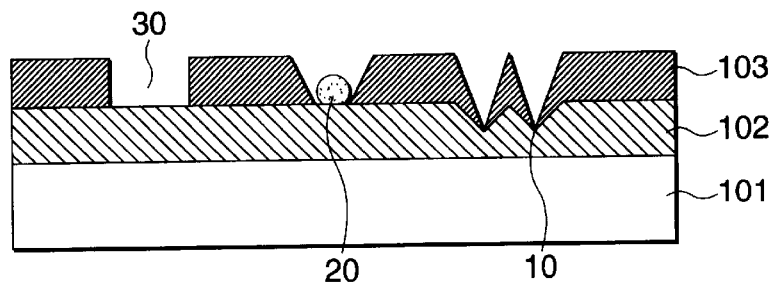
Figure 2C:
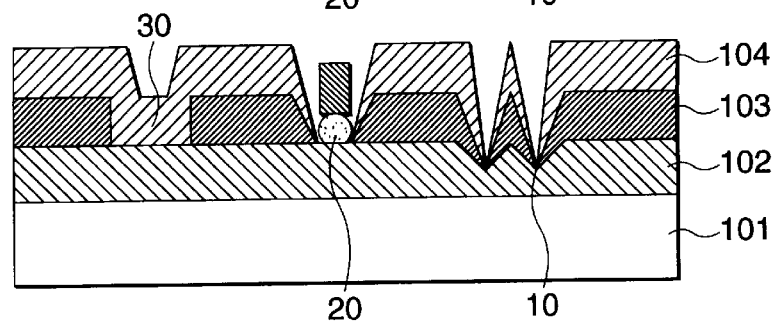

As shown in FIG. 2B, organic materials such as TPD and Alq3 are then sequentially stacked on the transparent substrate 101 on which the transparent electrodes 102 have been formed, to form a luminescent portion configured by the organic layer 103. As shown in FIG. 2C, thereafter, the metal electrode layer 104 is formed, so that luminescent pixels are formed into a matrix arrangement. In each of the pixels, a part corresponding to a region of the organic layer where the transparent electrodes 102 and the metal electrodes 104 intersect and face each other with interposing the respective regions is used as one unit. It is assumed that, in the same manner as the conventional art example shown in FIG. 4, a flaw 10 is produced in the transparent electrode 102 or a particle 20 is deposited onto the transparent electrode 102.

In the thus formed luminescent display of simple matrix driving, a driving source which scan-drives the transparent electrodes 102 and the metal electrodes 104 appropriately applies a voltage across the transparent electrode 102 and the metal electrode 104 that correspond to each of the pixels, and charges are supplied to the luminescent portion 103 of the pixel so that the pixel luminesces.

The driving source applies a voltage so that all the luminescent pixels of the luminescent display simultaneously luminesce. Under this state, it is checked whether a defective pixel such as a luminescence-defective pixel or a pixel which does not luminesce exists or not. Then, repairing is performed on such a defective pixel.

Figure 2D:
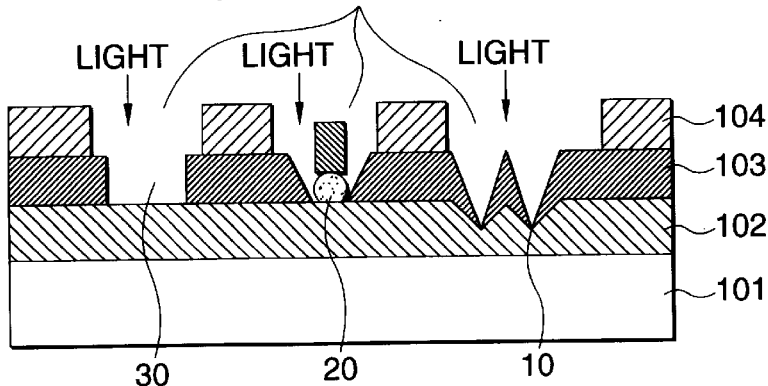

As shown in FIG. 2D, repairing is performed by irradiating a part of the unit pixel corresponding to the luminescent region which the defective pixel originally has, with a laser beam. Namely, a part of the metal electrode 104 facing the luminescent region is irradiated with a laser beam to be removed away. In this case, a laser spot is positioned in the following manner. The coordinates of the luminescent region (pixel) are previously measured. The defective part is determined by means of visual inspection using a microscope or the like, and then positioning of a laser spot is then performed.

According to this configuration, in the case where he defective part is sufficiently smaller than one pixel, only the defective part of the metal electrode 104 in the defective pixel is removed away, and a current flow between the metal electrode and the transparent electrode 102 which face each other via the organic layer 103 is allowed by the remaining metal electrode 104 excluding the defective part of the defective pixel, so that the defective pixel can luminesce. In the example described above, the laser beam irradiation is performed from the side of the metal electrode 104. Alternatively, the laser beam irradiation may be performed from the side of the transparent substrate 101 so as to remove away the defective part the metal electrode 104. In the case where the transparent substrate 101 has a low transmittance with respect to a laser beam, however, irradiation from the side of the metal electrode 104 is preferable.

Figure 2E:
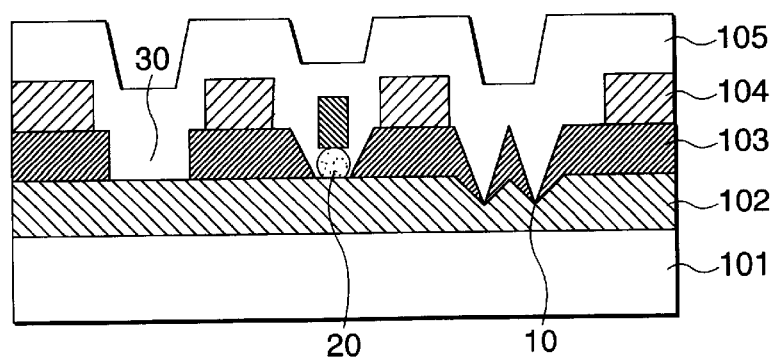

When the removal of the defective part of the metal electrode 104 is completed, a protective film 105 is laminated over the whole area above the transparent substrate 101 as shown in FIG. 2E, thereby forming a luminescent display of simple matrix driving.

Figure 3:
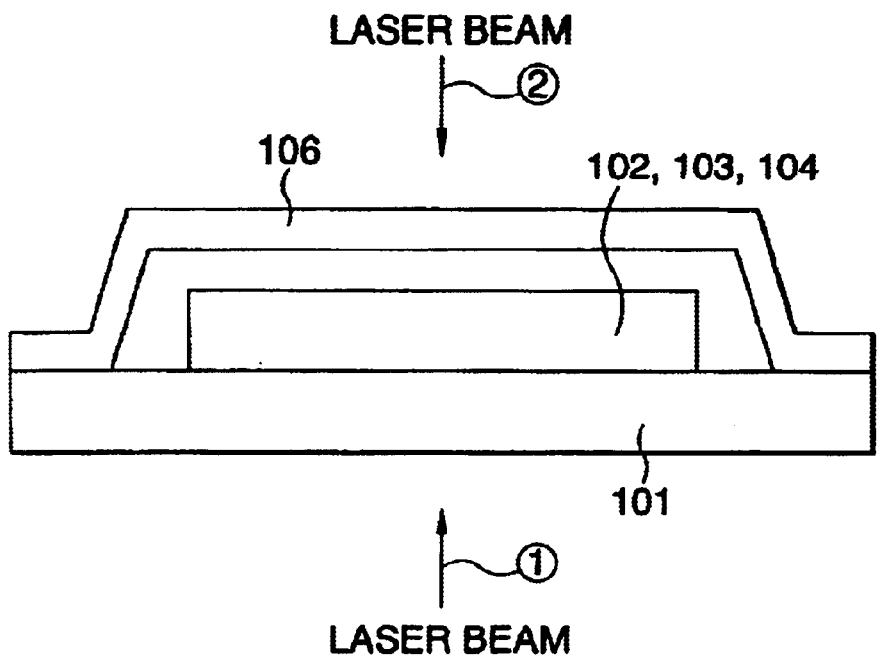
FIG. 3 is a view showing a state where a sealing cover is used in the luminescent display of the embodiment of the invention.

In the embodiment, the protective film 105 is formed. As shown in FIG. 3, for example, a sealing cover 106 may be attached so as to cover the transparent electrode 102, the organic layer 103, and the metal electrode 104, and may be sealed in the periphery of the transparent substrate 101. In this case, the removal of a defective part of the metal electrode 104 may be performed after the sealing cover 106 is attached. Specifically, in the case where the sealing cover 106 is made of a metal or the like and hence opaque, the laser beam irradiation is performed from the side of the transparent substrate 101 as indicated by (1). In the case where the sealing cover 106 is made of glass or the like and hence transparent, the laser beam irradiation may be performed from either of the side of the transparent substrate 101 as indicated by (1) or that of the sealing cover 106 as indicated by (2).

It is a matter of course that the sealing cover 106 may be additionally attached to a structure in which the protective film 105 has been laminated.

In the embodiment of the invention, only the luminescent display of simple matrix driving configured by the organic EL element which is formed by at least the organic layer 103, and the plural transparent electrodes 102 and the plural metal electrodes 104 which intersect with each other has been described as an example. The invention is not limited to this, and the manner of the arrangement of luminescent pixels and the kinds of the materials used in the luminescent portion are not particularly restricted as far as plural luminescent pixels can be formed by intersecting plural paired electrodes.

As described above, according to the invention, even when a short circuit between the transparent electrode and the metal electrode, or the like occurs and a defective pixel such as a pixel which does not luminesce or a luminescence-defective pixel is formed, repairing is performed so as to remove only a part corresponding to the defective part, in the metal electrode corresponding to the region which corresponds to the defective pixel, and in which the transparent electrode and the metal electrode intersect with each other. Therefore, a current flow between the metal electrode and the transparent electrode which face each other via the organic layer is allowed by the remaining metal electrode, thereby enabling the pixel and the subsequently scanned pixels to luminesce.

According to this configuration, it is possible to design a luminescent display which can be sufficiently put into a practical use even when the display has few defective pixels, thereby contributing to an improved yield due to repairing of defects.

What is claimed is:

1. A method of producing a luminescent display in which plural first electrodes that are arranged at predetermined intervals, a luminescent portion, and plural second electrodes that are perpendicular to said first electrodes, and that are arranged at predetermined intervals are sequentially stacked on a substrate, a luminescent pixel is formed by using, as a unit, a region where one of said first electrodes and one of said second electrodes and intersect with face each other with interposing said region, and a predetermined number of such luminescent pixels are arranged in a matrix form, said method comprises the steps of:

forming said first electrodes on said substrate;

sequentially stacking said luminescent portion and said second electrodes;

when an arbitrary one of said luminescent pixels which are arranged in a matrix form is defective, irradiating only a part of said second electrodes and corresponding to said defective luminescent pixel, with light; and removing away only the part which is irradiated with light.

2. A method of producing a luminescent display according to claim 1, wherein said substrate and said first electrodes are optically transparent, and said luminescent portion contains an organic compound.

* * * * *